United States Patent [19]
Elazouni

[11] Patent Number: 5,617,342
[45] Date of Patent: Apr. 1, 1997

[54] DISCRETE-EVENT SIMULATION-BASED METHOD FOR STAFFING HIGHWAY MAINTENANCE CREWS

[76] Inventor: Ashraf M. Elazouni, 1, Farakha St., Elmontaza, Zagazig, Egypt

[21] Appl. No.: 337,886

[22] Filed: Nov. 14, 1994

[51] Int. Cl.$^6$ ........................................... G06F 17/10
[52] U.S. Cl. .................................. 364/578; 395/209
[58] Field of Search ........................ 364/578, 551.01, 364/468, 402; 395/500

[56] References Cited

U.S. PATENT DOCUMENTS

| | | | |
|---|---|---|---|
| 4,901,260 | 2/1990 | Lubachevsky | 364/578 |
| 4,965,743 | 10/1990 | Malin et al. | 364/578 |
| 5,140,537 | 8/1992 | Tullis | 364/578 |
| 5,229,948 | 7/1993 | Wei et al. | 364/468 |
| 5,305,221 | 4/1994 | Atherton | 364/468 |
| 5,343,388 | 8/1994 | Wedelin | 364/402 |
| 5,369,570 | 11/1994 | Parad | 364/402 |
| 5,381,332 | 1/1995 | Wood | 364/402 |
| 5,406,476 | 4/1995 | Deziel et al. | 364/402 |

OTHER PUBLICATIONS

Osmani et al., "Evaluation of Road Maintenance Automation", Jour of Transportation Eng'rg, vol. 122, Iss 1, Jan. 1996, pp. 50–58.
Denning, "Expert Systems: Ready to Hit The Road?", Civil Engineering, Jun. 1992, pp. 71–74.
Foo et al., "Prototype Knowledge–Based System for Corrective Maintenance of Pavements", Jour of Transp. Eng'rg, vol. 121, No. 6, Nov. 1995, pp. 517–523.
Fwa et al., "Road–Maintenance Planning Using Genetic Algorithm:Analysis", Jour of Tranp. Eng'rg, vol. 120, No. 5, Sep. 1994, pp. 710–722.
Chan et al., "Road–Maintenance Planning Using Genetic Algorithm: Formulation", Jour of Transp Eng'rg, vol. 120, No. 5, Sep. 1994, pp. 693–709.
R.B. Newman, et. al, Maintenance Contracting, Dec. 1991, 10–11, Transportation Research Board Report #344/Attached are Iowa, Wyoming, and Massachusetts Reports.
Martin C. Rissel, et. al., Cost–Effective Staffing of Crews During Winter, Aug. 1985, p. 91, Public Works.
H. Randolph Thomas, Jr. et al., Construction Contract Staffing Needs, Jun. 1980, American Society of Civil Engineers, Journal of Construction Division pp. 101–116/Attached are the Studies of Washington State Highway Commision, and North Dakota State Highway Department.

*Primary Examiner*—Kevin J. Teska
*Assistant Examiner*—Tyrone V. Walker

[57] ABSTRACT

A maintenance management system is disclosed for staffing highway maintenance crews using discrete-event simulation and optimization techniques. Conveniently, the system is organized in four stages; making determinations, model building, simulation model, and experimentation and analysis. Determinations support setting agency's own standards regarding maintenance including identifying maintenance specialities, establishing standard crews, setting standard productivity rates, estimating optimum maintenance workloads, estimating costs of delaying maintenance, and deciding the planning period. Model building involves outlining the repair request system including highway system configuration, organization structure, crew assignments, input data, and maintenance model. The simulation model executes an initialization routine and events and runs the events through a time and event schema until the event queue in the simulator is emptied. The experimentation and analysis stage includes designing experiments, generating data, and employing optimization techniques to determine the optimum size of the maintenance staff.

18 Claims, 7 Drawing Sheets

The Stages of the Maintenance Management System.

FIG. 1: The Stages of the Maintenance Management System.

FIG. 2: Portray for the System Configuration and Organization Structure.

FIG. 3: The Next-Event Logic for Simulating Discrete-Event Models.

FIG. 4: Model Initialization Routine.

FIG. 5: The Logic Associated with the Generation of a Repair Request (Arrival of a Repair Request).

FIG. 6: The Logic Associated with the Departure of a Crew after Finishing a Repair Request (End-of-Service of a Repair Request).

FIG. 7: Schematic Diagram for the Maintenance Model.

DISCRETE-EVENT SIMULATION-BASED METHOD FOR STAFFING HIGHWAY MAINTENANCE CREWS

BACKGROUND—FIELD OF INVENTION

This invention relates to maintenance management systems, specifically to such systems which are used as a basis for staffing the various types of highway maintenance crews.

BACKGROUND—DESCRIPTION OF PRIOR ART

Highway agencies are faced with the challenge of maintaining the level-of-service demands of a deteriorating infrastructure at the time of increasing the cost of maintaining maintenance crews. Efforts are being continually done to determine if costs could be reduced without sacrificing quality. Inadequate maintenance staff will not ensure timely responses for emergencies and will leave a long queue of backlogged maintenance workloads. On the other hand, two many maintenance crews will substantially increase expenditures. Therefore, a need exists for a logical and definable method for determining manpower and equipment needs.

Twelve states, three provinces, and one county reported having guidelines for determining maintenance staffs as shown below:

Seven agencies established a minimum staff level based on their needs for snow and ice control.
Two agencies based their staffing on maintenance workload.
Two agencies based their staffing on their maintenance management systems calculations.
Two agencies have determined a core staff.
One agency based the minimum staff on the results of a special study.
One agency had an assigned maximum quota.
One agency based its needs on the number of maintenance inspectors required.

Iowa and Wyoming are examples of two states that established minimum staffing levels based on their needs for snow and ice control. These two methods are presented below:

Iowa developed an analysis to determine the needs of trucks and personnel to control snow and ice. The needs for each maintenance area are based on the following calculations:

1. The number of snow removal trucks is equal to a location factor times 1.11 for average deadheading times the equipment downtime factor. Currently, the equipment downtime factor is 1.0681, which indicates an equipment up-time rate of about 93 percent.
2. The number of operators and mechanics equals the location factor times a staffing factor.

The staffing factor is currently set at 1.54338. This factor increases the staffing level to provide for mechanics during storms and operators for the night shift.
3. The location factor is the sum of:

The lane miles of service level A, urban area interstate divided by 20; plus
The lane miles of service level B, rural area interstate divided by 25, plus
The lane miles of service level B divided by 30; plus
The lane miles of service level C divided by 40; plus
The lane miles of service level D divided by 50; plus
The lane miles of park and institutional roads divided by 50; plus
The number of interchange ramps divided by 12; plus
The number of rest areas divided by 4; plus
The number of weigh stations divided by 4; minus
The lane miles of park and institutional roads under contract maintenance divided by 16; minus
The lane miles of primary extensions under contract maintenance divided by 150.
4. The staffing factor is set by experienced maintenance staff members.

Wyoming also based its minimum staffing levels on the needs for snow and ice control. Roads assigned to snow removal contractors are excluded from the calculations. The number of trucks is determined for each foreman's area by applying the following ratios:

A truck for eight centerline miles of high service interstate.
A truck for fifteen centerline miles of high service primary.
A truck for thirty centerline miles of medium service highways.
A truck for fifty centerline miles of low service highways.
The number of operators is determined by applying these criteria:

Two operators per truck (to cover 2 full shifts) for high service highways.
One operator and half per truck (one for the day shift and half for the off shift) for medium service highways.
One operator per truck for low service highways.

As outlined above, Iowa and Wyoming guidelines for staffing are based on empirical formulae without giving any logical reasoning for making assignments. In addition, these formulae were exclusively developed to determine the minimum staffing need for snow and ice control without showing their applicability to other maintenance specialities.

Massachusetts developed and implemented a staffing plan based on standard maintenance crews. A standard crew was established for each maintenance speciality. Each maintenance crew is assigned to a fixed proportion of work in its speciality. For instance, a standard highway repair crew consists of a highway repair foreman, a highway maintenance working foreman, a maintenance equipment operator I, and five maintenance workers. This crew is expected to handle a repair section of 125 lane-miles of highway. The number of crews per district to handle a particular maintenance speciality is calculated by dividing the total lane-miles in the district by the length of a repair section that is assigned to one crew.

Although Massachusetts study introduced the concept of establishing a standard crew size for each particular maintenance speciality, this method and the other guidelines developed before suffer from a number of disadvantages:

1. None of these guidelines involved a method to anticipate future maintenance workloads and relate manpower and equipment needs to the anticipated workloads.
2. The linear miles used in these methods as a basis for determining the number of maintenance crews has no direct bearing on the required maintenance workload.
3. Staffing in these methods are based on empirical formula without giving logical reasoning.
4. None of these methods employ a scientific technique for staffing so that sensitivity analysis can be performed and different alternatives can be evaluated.

SUMMARY OF THE INVENTION

Accordingly, several objects and advantages of my maintenance management system are:
1. Establishes statistical distributions that reflects the non-deterministic nature of the generation of maintenance workloads, thus introduces a meaningful method and realistic way by which future workloads could be anticipated.

2. Emphasizes the concepts of standardization, specialization, and efficiency, i.e., a crew of a standard size and mix with a standard productivity rate, specializes in one maintenance speciality, and is allocated to a workload that it can handle the most efficient way.
3. Builds a strong rationale behind each step in the system so that the decision maker will ultimately be so confident to use the method to make decisions regarding staffing.
4. Employs simulation and optimization techniques that:
   Introduces a natural framework for estimating the needed crafts to perform maintenance activities.
   Outlines a repair request system that portrays a configuration for the highway network, defines an organizational structure and administrative procedures, and defines a logic and set priority, for work assignment.
   Defines performance measures for the system and collects statistics for them as simulation time goes on.
   Presents a scientific technique that can be used as a framework for making sensitivity analysis and evaluating different scenarios.
5. Represents a management tool that can be used successfully for long-term planning.
6. Offers a powerful method for determining an agency's own resources before making decisions to contract out.
7. Represents a tool to determine, on scientific basis, the number of maintenance crews to be maintained by a highway maintenance department in order to perform a particular maintenance speciality with the least total cost for the public and the maintenance department.

Further objects and advantages of my invention will become apparent from a consideration of the drawings and ensuing description.

DESCRIPTION OF THE PREFERRED EMBODIMENT

Figure 1:
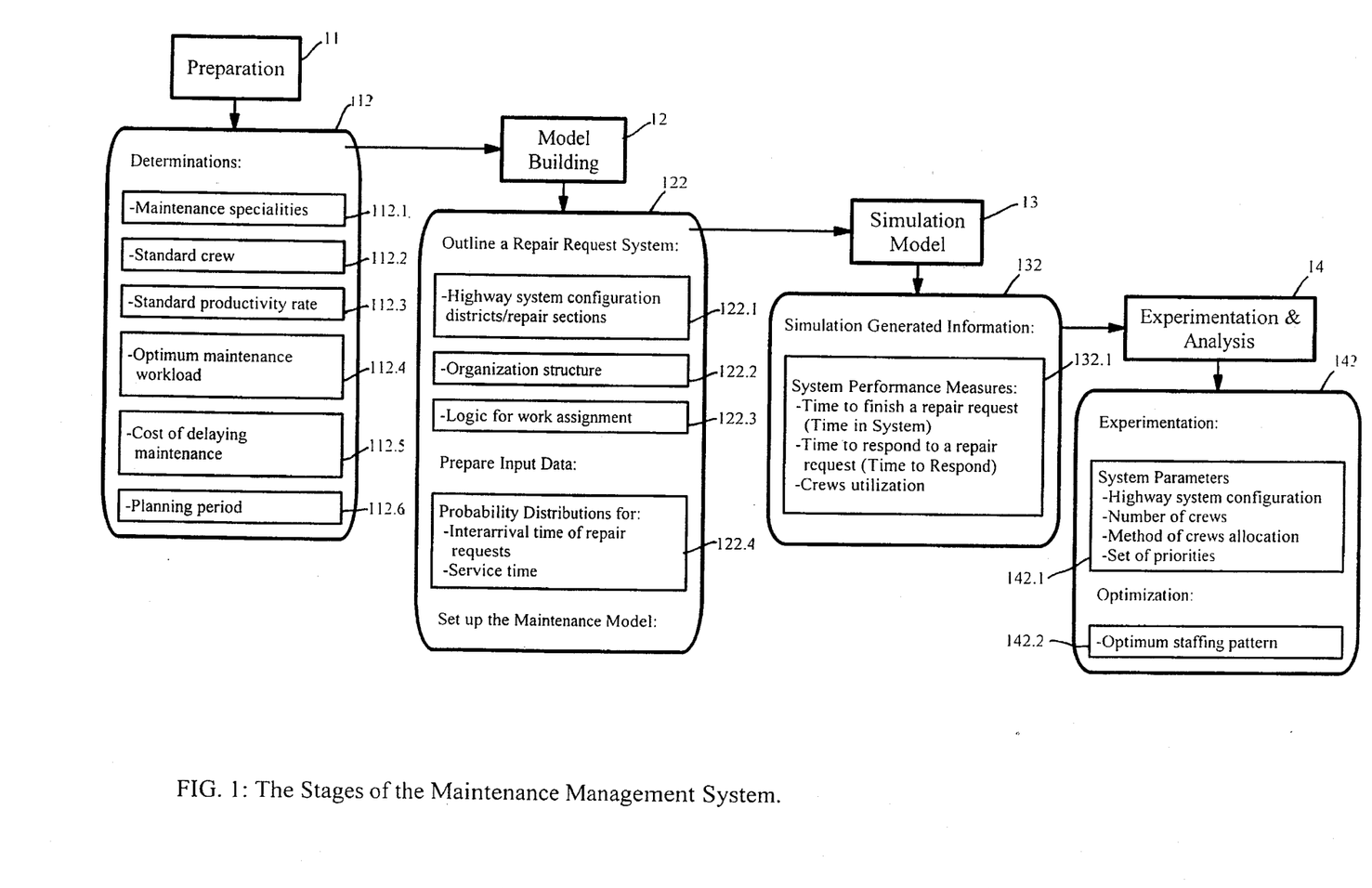
FIG. 1 The stages of the maintenance management system.

FIG. 1, a diagram illustrating the use of the simulation-based method for staffing highway maintenance crews. Even though this is the preferred embodiment, there is nothing about the invention that precludes it from being implemented in various manifestations other than the one described here.

In order to support the invention function, the method is comprised of four primary stages as shown in FIG. 1.

The preparation stage (as seen in Stage 11 of FIG. 1) supports making determinations generally designated by 112 of component classes 112.1 in which all maintenance specialities are identified by the senior personnel of the highway maintenance department. A A standard crew 112.2 is established for each maintenance speciality. Standard productivity rate 112.3 is determined for each standard crew. An optimum maintenance workload 112.4 is determined for each standard crew, which could be defined as the workload the standard crew can handle most efficiently. The cost of delaying the accomplishment of maintenance 112.5 is basically an estimation of the consequent costs incurred for not timely performing a maintenance workload. The planning period 112.6 is the analysis period during which staffing is made.

Figure 2:
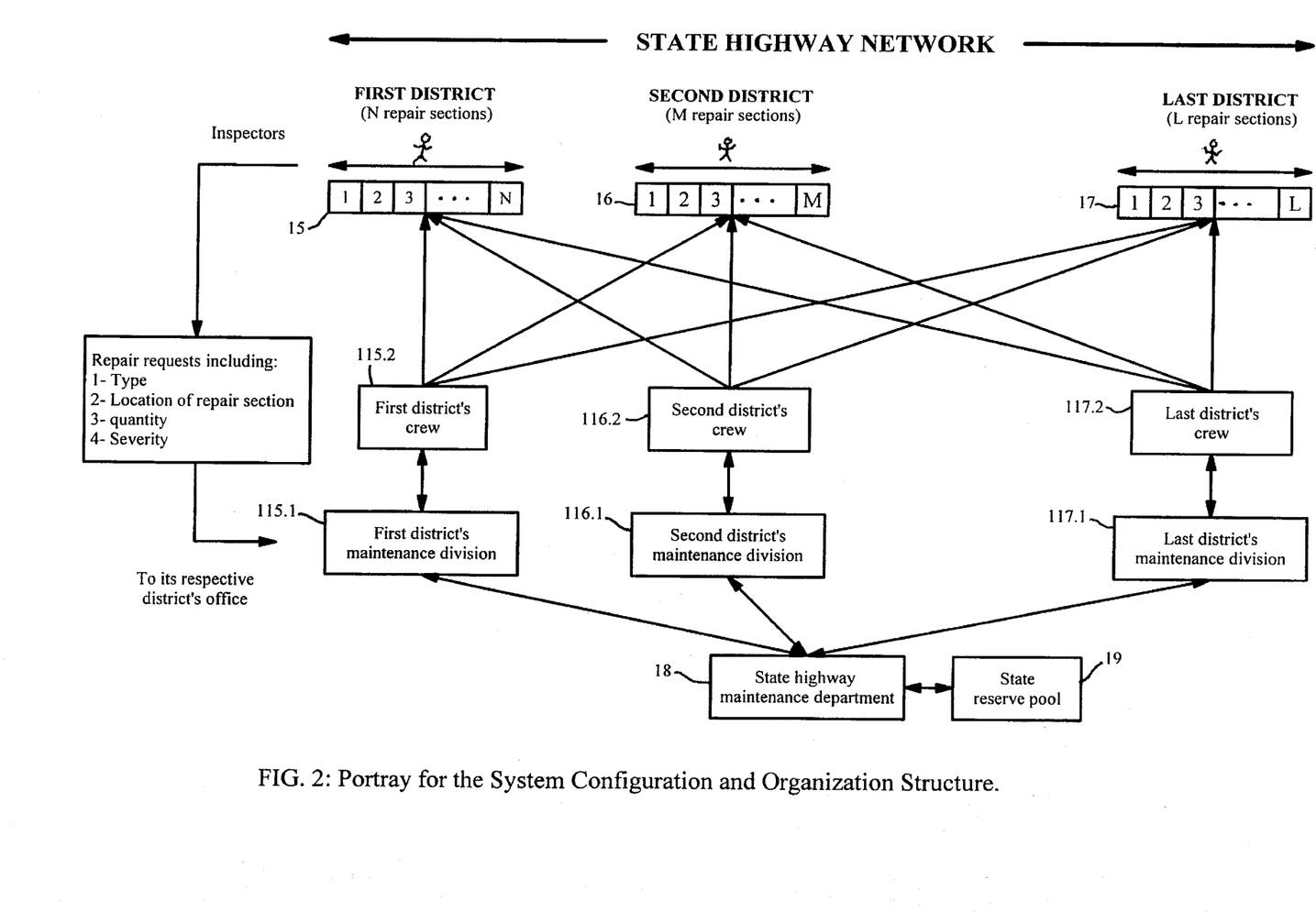
FIG. 2 Portray for the system configuration and organization structure.

The model building stage (as seen in stage 12 of FIG. 1) supports outlining a repair request system, preparing input data, and setting up the relevant highway maintenance model generally designated by 122 of component classes 122.1 in which a configuration is portrayed by dividing the network into districts (as shown in FIG. 2), the highways included in each district are divided up into equal segments or repair sections. A repair section is entitled to request for maintenance of any speciality via a standard form known as a repair request. Organization structure 122.2 describes the administrative personnel of the districts maintenance divisions and the state highway maintenance department along with the flow lines of authority and responsibility. Defining the logic for work assignments 122.3 sets priorities for accomplishing repair requests within a district and decides about the movement of crews among districts. Preparing input data includes establishing probability distributions 122.4 for the parameters of each individual maintenance speciality including the interarrival time of repair requests at a typical repair section and the service time. Finally, setting up maintenance model takes input from the first two steps so as to define a queue system with customers, servers, priorities, etc.

The simulation stage (as seen in stage 13, FIG. 1) supports the development of a simulation software for models built at the model building stage. Part of this stage is provided by the discrete-event simulator in the preferred embodiment. In particular, the flowchart outlining the next-event logic for simulating discrete-event models (described in detail in FIG. 3) is provided by the discrete-event simulator. The rest of the simulation model's event structure and control flow is considered the second portion of the simulation stage and is outlined in detail in the descriptions of FIG. 4, FIG. 5, and FIG. 6. When simulation is performed via the simulation model 13, many forms of information can be generated as generally designated in 132. In the preferred embodiment of the invention, statistics on the system performance measures 132.1 are produced by the discrete-event simulation including the time to finish a repair request, the time to respond to a repair request, and the utilization of maintenance crews.

The experimentation and analysis stage (as seen in stage 14, FIG. 1) supports the experimentation and optimization processes and is generally designated by 142. This stage involves basically running the simulation model with different scenarios to obtain the optimum level of staffing. Experimentation can be performed on system parameters 142.1 including the highway system configuration, the number of maintenance crews, the way crews are allocated among districts, and the set of priorities. Optimization is performed after designing experiments and generating enough information. The optimum number of crews 142.2 is the one corresponds to the least cost scenario.

As described above there are five unique capabilities in the invention:
1. Standardizes maintenance crews, and maintenance specialities.
2. Collects data about the interarrival time of repair requests, the distribution of the service time, and the cost of delaying maintenance.

3. Supports building a model that outlines the existing repair request system and defines the logic for work assignment.
4. Develops a simulation software that simulates the model for the planning period and collects statistics about the system performance measures under various scenarios.
5. Determines the optimal number of crews based on the minimization of the total costs.

These are not dependent on each other. The simulation technique, for instance, could be implemented with different highway system configurations or without collecting accurate data, perhaps not so efficiently, In this embodiment the five major features of the invention have been united to form an efficient and compact combination as described herein.

The following four sections illustrate the manner in which the invention has been implemented in the preferred embodiment.

Preparation

This is the first stage in the method and involves making determinations regarding the maintenance operations and crews. The proposed determinations would lend stability to the maintenance work force and be conducive to the uniformity in the levels of service under the proposed maintenance management system. This stage is performed for a state highway maintenance department with the involvement of its senior maintenance engineers to account for its peculiars. In this particular embodiment, this stage includes identifying the maintenance specialties, establishing a standard crew for each maintenance speciality, estimating standard productivity rates of crews, establishing the optimum maintenance workloads of crews, estimating costs for not accomplishing maintenance on time, and deciding a planning period for which staffing is determined. The following sections discuss these parameters.

Identifying maintenance specialities is the first task that has to be done by the maintenance department. There is still some controversy on some activities whether they are maintenance or new construction work. In other words, whatever is considered as a maintenance by some maintenance departments is considered as a new construction by others. Therefore, each maintenance department should set its own criteria to distinguish between maintenance and new construction and use these criteria to identify all maintenance specialities. Once a list of maintenance specialities is prepared, subsequent tasks have to be performed include giving a thorough definition for each speciality, preparing manuals to accomplish maintenance according to specifications, and training inspectors on how to measure the quantity of work and report severity.

The next step involves establishing a standard crew for each maintenance speciality. The standard crew is basically the mix of employees that will be required by personnel classification. This is accomplished by relating the knowledge, skills, and abilities required to perform effectively the maintenance speciality. Standardization lends stability and integrity to the maintenance work force which increases productivity. In addition, it provides the opportunity for better training and establishes more meaningful career ladders which are conducive to improved morale. In general, standardization would be inducive to increased efficiency and improved economics in the overall maintenance of highways. The established standard crew is considered as the unit of resource for a particular maintenance speciality. The question then is how many crews the maintenance department needs to handle all the anticipated work. Crew foreman is the best person to establish the standard crew for his speciality.

After establishing the standard crew for a particular maintenance speciality, the following step is to estimate its standard productivity rate. The standard productivity rate is expressed as a planned number of man-hours per unit of work-measurement. It varies in response to many influences, including individual capabilities, individual efforts, weather conditions, terrain, traffic volumes, and soil conditions. The most capable person to establish these rates is the foreman of the particular maintenance crew.

One of the standards of a maintenance crew is the optimum maintenance workload which can be defined as the work space along with the number of work measurement units the standard crew can handle most efficiently. Working in either smaller or bigger work sections will adversely affect the crew productivity. For instance, it was observed that a crew of one painter and one assistant gives the highest productivity when it is allocated to a room of about 48 square meter walls. Making different assignments was noticed to adversely affect the crew's productivity. The best source of these information is the crew foreman.

The next step in this stage represents the consequences of not performing the maintenance activities on time. As a matter of fact, the delay in performing maintenance means extra costs for both the maintenance department and the public. The maintenance department pays its share through the increased deterioration in its utilities and probably the generation of extra maintenance work that was primarily caused as a consequence of delaying the original maintenance work. The public pays its share through the accidents that happen, the extra mileage that needs to be traveled, or the damages that happen to their cars. Many studies were done in the literature to estimate the cost consequences of delaying maintenance.

The last step in this stage is to decide the planning period for which staffing the various types of maintenance crews is determined. This planning period depends on the financial plans and other strategic plans of the maintenance department.

Model Building

The system in which a maintenance workload emerges at a section of the highway, an inspector reports its type, quantity, and severity in a repair request, a maintenance crew moves to perform this repair work, and then moves to another section according to a pre-set priority to handle another repair request can always be formulated in a model of input and output. Building a model for an existing repair request system needs thorough understanding about how the real system works, or if a new system is to be designed, how the new system is supposed to work. This effort requires a continual dialogue between the modeler and other personnel who are knowledgeable about the system operation. Building the model in this particular embodiment involves portraying a configuration for the highway system, defining the organization structure for the maintenance department, and setting the logic and priority of work assignment. In addition to a thorough understanding for the way the system works, the modeler will need input data. In this particular embodiment, the data required in this stage include the distribution of the interarrival time of repair requests, and the distribution of the service time. Accurate data in the form needed for simulation purposes is often not immediately available. Once the system is outlined and input data are prepared, the next step is to set up the relevant maintenance speciality model.

The first step in the model building is to outline a repair request system which involves portraying a configuration of the highway network, defining a structure of the maintenance department, and setting a logic for work assignment. FIG. 2 illustrates these three concepts. Portraying a system configuration involves basically dividing the whole state into districts, the highways encompassed in each district are divided up to fixed proportions each is referred to as a repair section and represents the optimum maintenance workload for a particular maintenance crew. A typical repair section could be a fixed lane-miles of a freeway for pavement maintenance speciality, or a bridge for bridge maintenance speciality. These sections are given numbers ascendingly according to their physical proximity to each other. As shown in FIG. 2 blocks 15, 16, and 17 represent three districts with N, M, and L repair sections respectively. Each district has a district maintenance division 115.1, 116.1, and 117.1 which plans, organizes, directs, and controls day to day efforts of maintenance crews in their districts. Inspectors are employed at each district to watch closely and report maintenance requirements in the form of repair requests that include type, location, quantity, and severity of the required maintenance work within their districts. In addition, there is the state maintenance department 18 which also plans, organizes, directs, and controls maintenance works at the state level. Essentially, two types of permanent maintenance crews are staffed for each maintenance speciality; those permanently assigned to districts 115.2, 1 16.2, 117.2 and a reserve pool 19 of maintenance crews assigned to the state maintenance department. The logic for making work assignments and setting priority among repair sections is explained in the simulation model stage.

The second step in model building is the procurement of input data. Data include the interarrival time of repair requests of each maintenance speciality at a typical repair section and the service time of a request. Historical records if accurately recorded can be a reliable source of these data. The distribution of the interarrival time is usually assumed to be exponential, but in our case it can be any one of the known types of distributions. The service time distribution, which is a function of the work quantity and productivity rate, could come from any one of the known distributions. If the collected data do not fit any one of the known distributions, an empirical distribution for the data can be developed and utilized.

The third step in model building is to set up the relevant maintenance speciality model. The following are the terminology and notation used:
E=expectation operator.
$W_c$=cost of delaying maintenance.
$S_c$=service cost (cost of maintenance crews).
$T_c$=total cost.
S=number of maintenance crews.
$C_s$=cost of each maintenance crew.
M=number of repair sections.
$C_i$=cost of delaying maintenance for a repair section (i) per unit of time.
$W_q(i)$=time of delaying maintenance for a repair section (i).

The task of maintaining in operational order certain number of M repair sections by S maintenance crews can be represented as a queuing model. The repair sections are considered as customers in the system. The maintenance crews are considered as individual servers in the queuing system since they work individually on different repair sections. The input population for this model is finite, and the queuing discipline is general in the sense that it could be first in first out (FIFO) or last in first serve (LIFS) or whatever policy the management sets for serving the repair sections.

In order to utilize this model in the maintenance environment, we have to relate the staffing level to the size of highway network. The decision regarding the amount of service capacity (number of maintenance crews) is based on two considerations. The first is the cost of service, and the second is the cost of delaying maintenance. Usually the cost of service is easily obtained, and provided that the cost of delaying maintenance is evaluated explicitly, the objective would be to determine the level of service (number of crews) which minimizes the total expected cost of providing the service and delaying maintenance. Thus, the mathematical statement of the objective is to minimize E(Tc) for the planning period.
$E(T_c)=E(S_c)+E(W_c)$
$E(T_c)$=Expected total cost
$E(S_c)$=Expected service cost
$E(W_c)$=Expected cost for delaying maintenance.

$$E(T_c) = C_s S + \sum_{i=1}^{M} C_i W_q(i)$$

Figure 7:
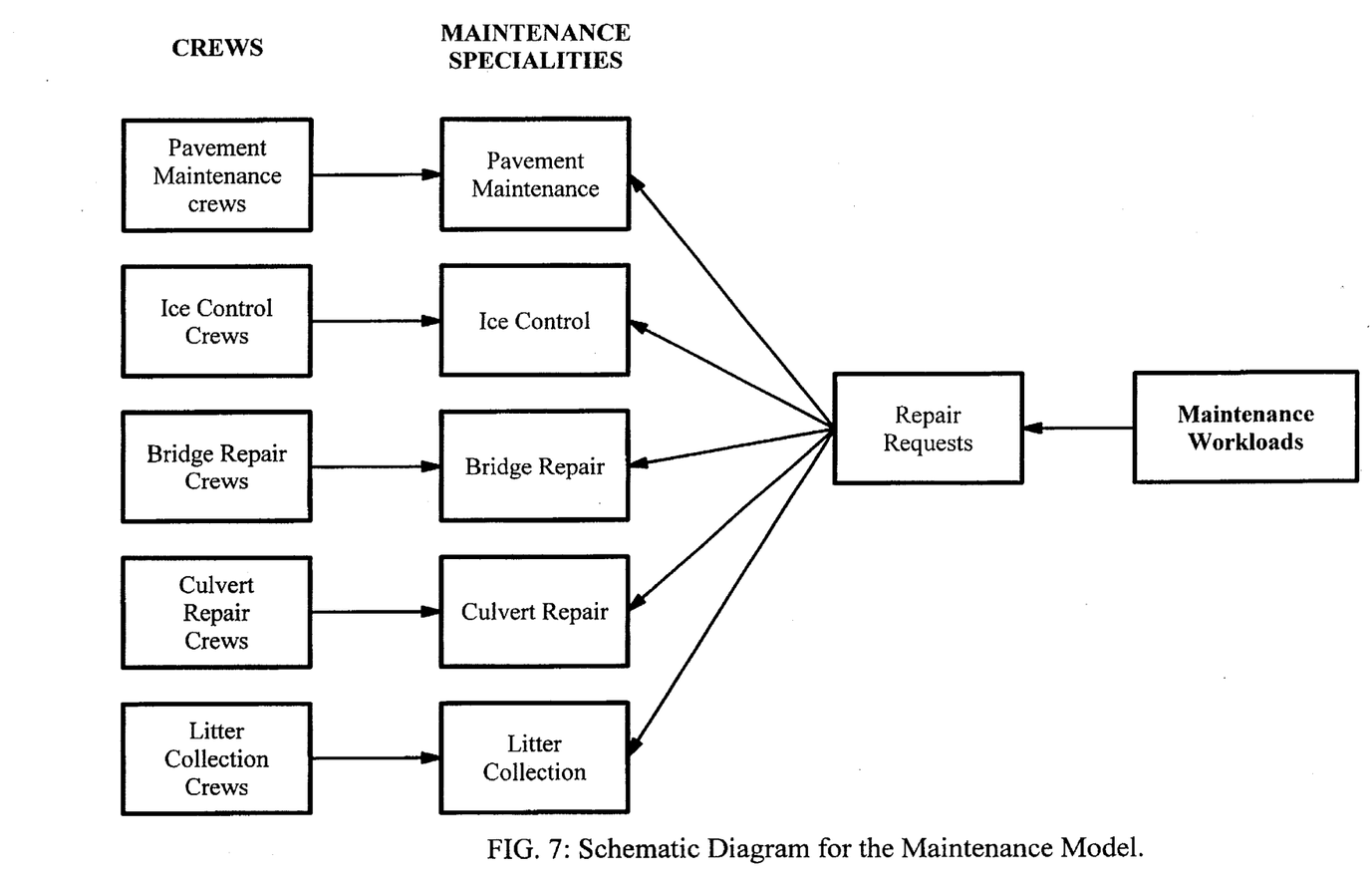
FIG. 7 Schematic diagram for the maintenance model.

As explained in the preparation stage, the maintenance workload can be sorted to specialities requiring different types of crews. Maintenance specialities include pavement maintenance, ice control, bridge repair, culvert repair, and litter collection. Instead of representing maintenance in a micro level as one highway system needing work, the maintenance workload can be represented as five types of highway systems. Hence, we can have a hypothetical highway system representing each maintenance speciality. As an example, pavement maintenance works can be grouped together and represented by a single highway system. Accordingly, the number of highway systems is determined by the types of maintenance specialities. The model can be generalized to estimate the number of crews of different levels of training by dividing each highway system into smaller ones depending on the level of speciality needed for each crew. FIG. 7 is a schematic diagram for the above representation.

Simulation Model

The goal of the simulation model is to determine the optimal number of maintenance crews from each speciality. This is achieved by determining the delay in accomplishing maintenance. The delay is basically the time in system since a repair request is introduced until repair work is accomplished. The simulation model calculates the delays in all repair requests under each scenario. A scenario represents of a given number of maintenance crews. The simulation model is run, with a run time equals the planning period, under different scenarios to obtain the least cost scenario.

The simulation model is of the discrete-event type. The first step in constructing this model is to express the real system in terms of its key events. An event is defined as an instantaneous occurrence which may change the state variables of the system. The state variables of the system are the status of a maintenance crew, the number of repair requests waiting in a queue to be accomplished, the delay of a repair request in the system, and the number of repair requests in the system.

In this particular embodiment, there are two types of events, namely, the generation of a repair request at a repair section (Arrival of a repair request), and the departure of a maintenance crew after accomplishing maintenance at a repair section (End-of-Service of a repair request). A generation is an event because it causes the system status (state variable) to change from idle to busy or the number of repair requests in the system (state variable) to increase. Correspondingly, a departure is an event because it causes the status to change from busy to idle, or the number of repair requests in the system to decrease.

Figure 3:
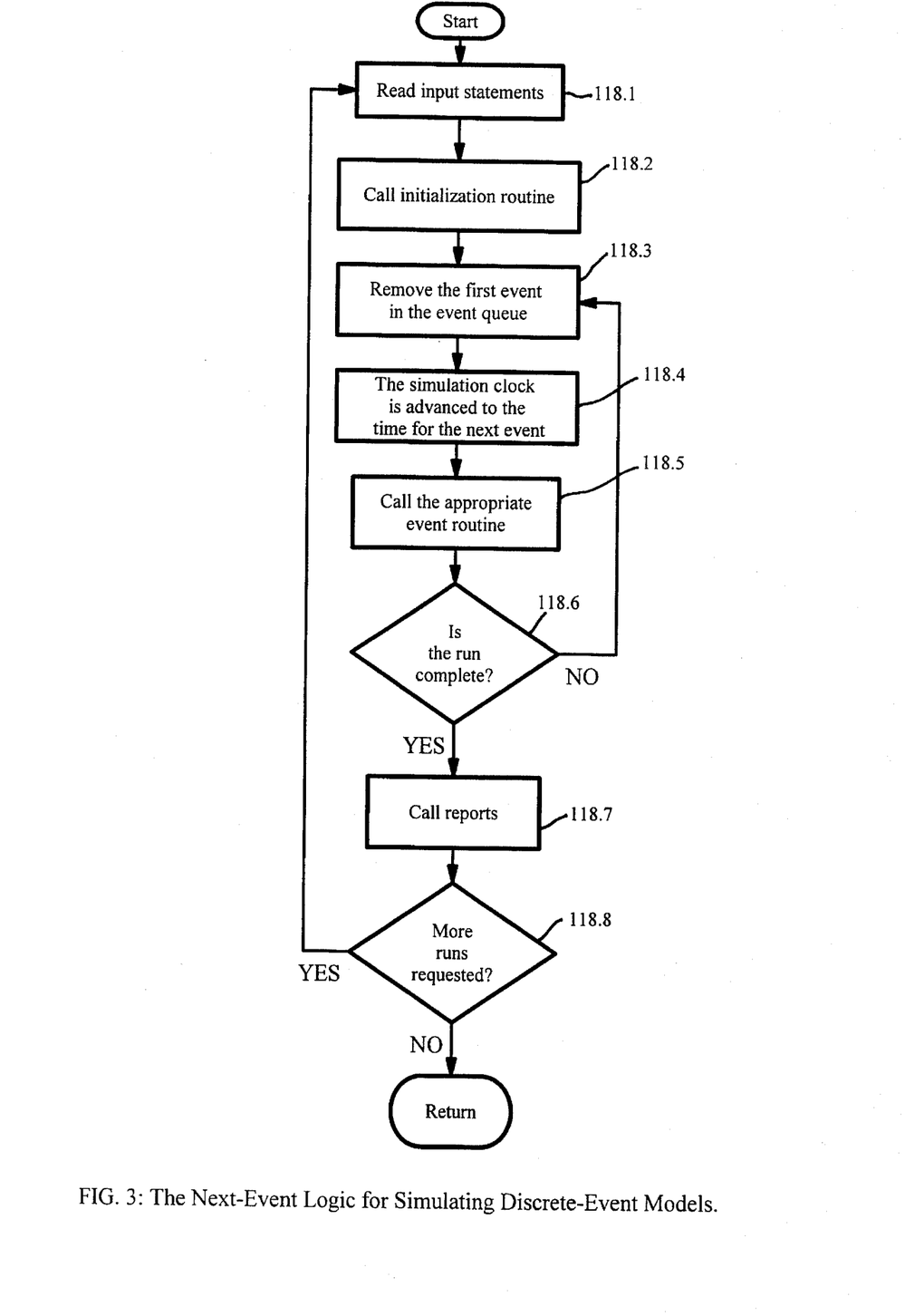
FIG. 3 The next-event logic for simulating discrete-event models

The next-event logic for simulating discrete-event models is depicted in FIG. 3. The simulator processor begins by reading 118.1 the input statements, if any, and initializing variables. A call 118.2 is then made to the initialization routine which specifies additional initial conditions for the simulation. The processor then begins execution of the simulation by removing 118.3 the first event from the event queue. Events are ordered on the event queue based on low values of event times. The simulation clock is advanced 118.4 to the event time of the next event. The processor then calls 118.5 the appropriate event routine. Following the execution of the event routine, a test 118.6 is made to determine if the simulation run is complete. A discrete-event simulation is ended if no events remain on the event queue for processing, or the simulation clock time is greater than or equal to the ending time of the simulation. If the run is not complete, the first event is removed 118.3 from the event queue and processing continues. Otherwise, a call 118.7 is made to report subroutine. After the return from report subroutine, a test 118.8 is then made on the number of runs remaining. If more runs remain, control returns to initialization 118.1 and the next simulation run is executed. Otherwise, a return is made from the simulator processor to the operating system.

Figure 4:
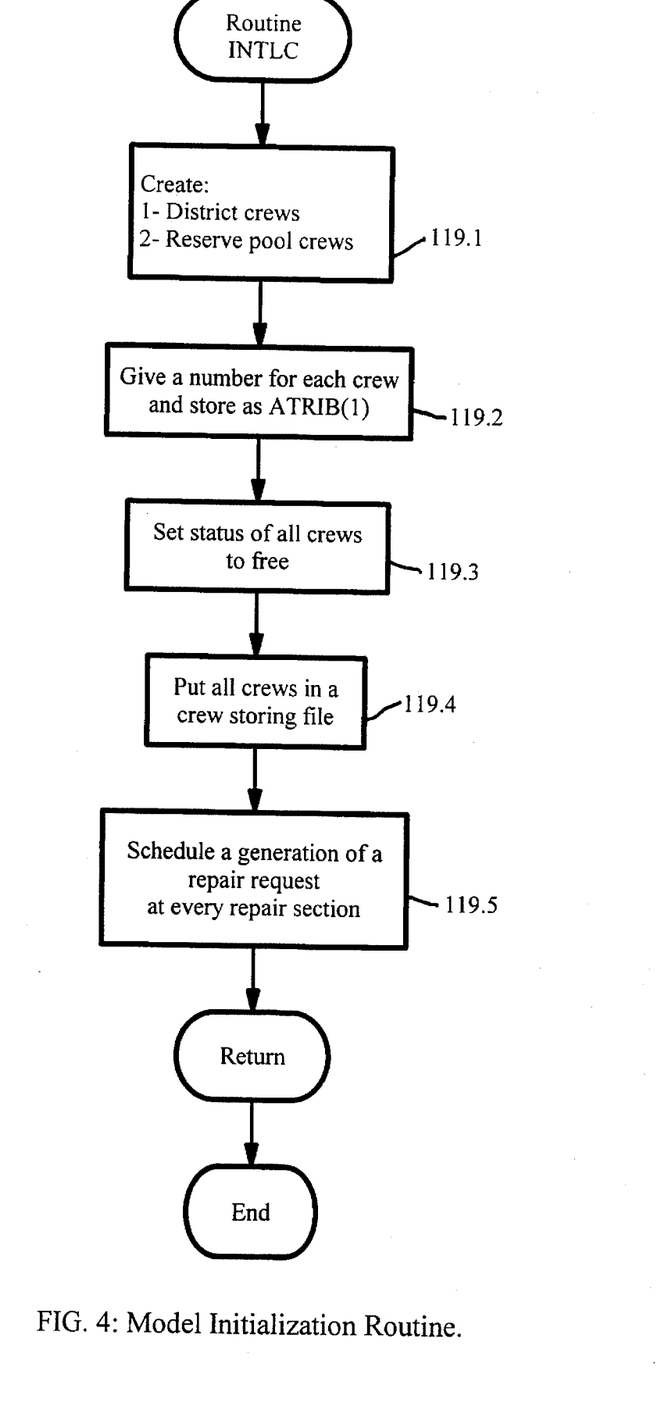
FIG. 4 Model initialization routine.

FIG. 4 is a flowchart that represents the initialization of the simulation model which specifies additional initial conditions for the simulation. It involves creating 119.1 entities that represent crews for the relevant maintenance speciality. Each district is allocated a crew, and the rest of the crews become a part of the reserve pool which is assigned to the maintenance department. Each crew is given 119.2 a number and stored as its first attribute. There is a file for each crew that carries the same number as the crew and is used to queue all the repair requests assigned to that crew. For each created crew set 119.3 its status to free and put 119.4 all the crews in a crew storing file. When all relevant crews are initialized, the second part of the initialization routine is to schedule 119.5 an arrival of a repair request at every repair section and put all these arrival events in the event queue at time 0.0. When all repair requests are created, a return is made to the flow control of the processor which will start running the model.

Figure 5:
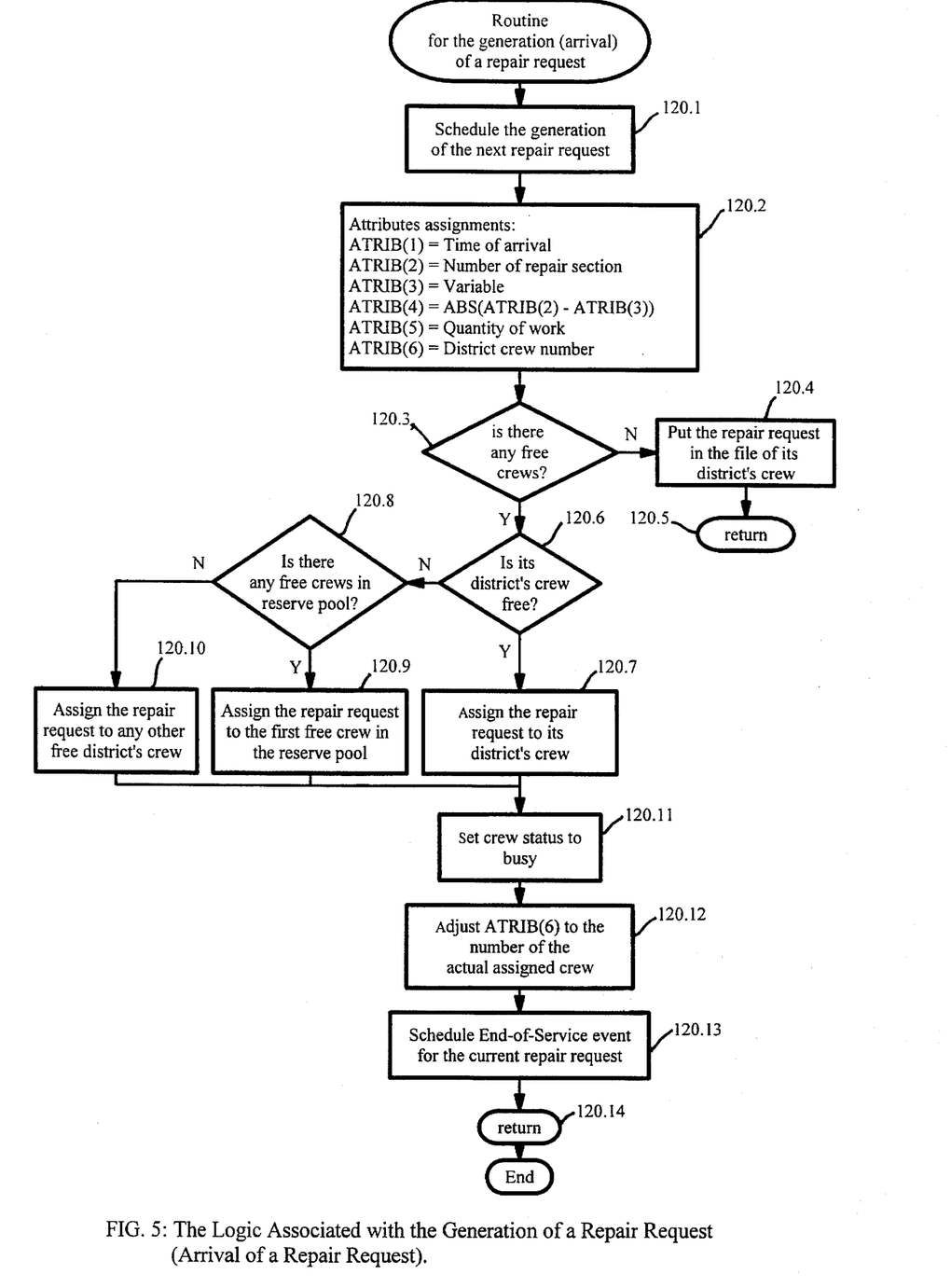
FIG. 5 The logic associated with the generation of a repair request (arrival of a repair request).

First, consider the logic associated with the generation of a maintenance repair request. FIG. 5 is a flow chart that outlines the logic for this event. Before processing the arrival of the current repair request, schedule 120.1 the next arrival to occur at the same repair section. Then, assign 120.2 values for the attributes of the current repair request; ATRIB(1) records the time the repair request arrived, ATRIB(2) is the number of the repair section where the repair request was generated at, ATRIB(3) is an integer variable that changes continuously to reflect the number of the repair section a crew is working at while the current repair request is in its file, ATRIB(4) calculates the absolute difference between ATRIB(2) and ATRIB(3). Ranking based on low value of ATRIB(4) will give priority to achieve the repair request of the closest repair section to the section the crew is working in at any time. ATRIB(5) is the quantity of work in the repair request, and ATRIB(6) is the number of the actual crew used for accomplishing the current repair request. Then, the disposition of the current repair request is determined based on the status of the crews. A test 120.5 is made on the number of free crews waiting in the crew storing file. If there is no free crew the repair request is placed 120.4 in the file of its own district's crew. Then, no further processing is made and a return to the processor is made. If there is a free crew in the crew storing file, a test 120.6 is made to find out whether the crew of the district of the current repair request is available, if yes the repair request is assigned 120.7 to its own district's crew. If not, another test 120.8 is made to find any free crew in the reserve pool. If yes, assignment 120.9 is made to the first free crew in the reserve pool, if not, the repair request is placed 120.10 in the file of any other free district's crew. For all the assignments made in 120.7, 120.9, and 120.10, the status of the assigned crew is set 120.11 to busy. The value of ATRIB(6) is adjusted 120.12 to the number of the crew the repair request was actually assigned to. Finally, an end-of-service event is scheduled 120.13 for the current repair request, and a return 120.14 is made to the flow control of the processor.

Figure 6:
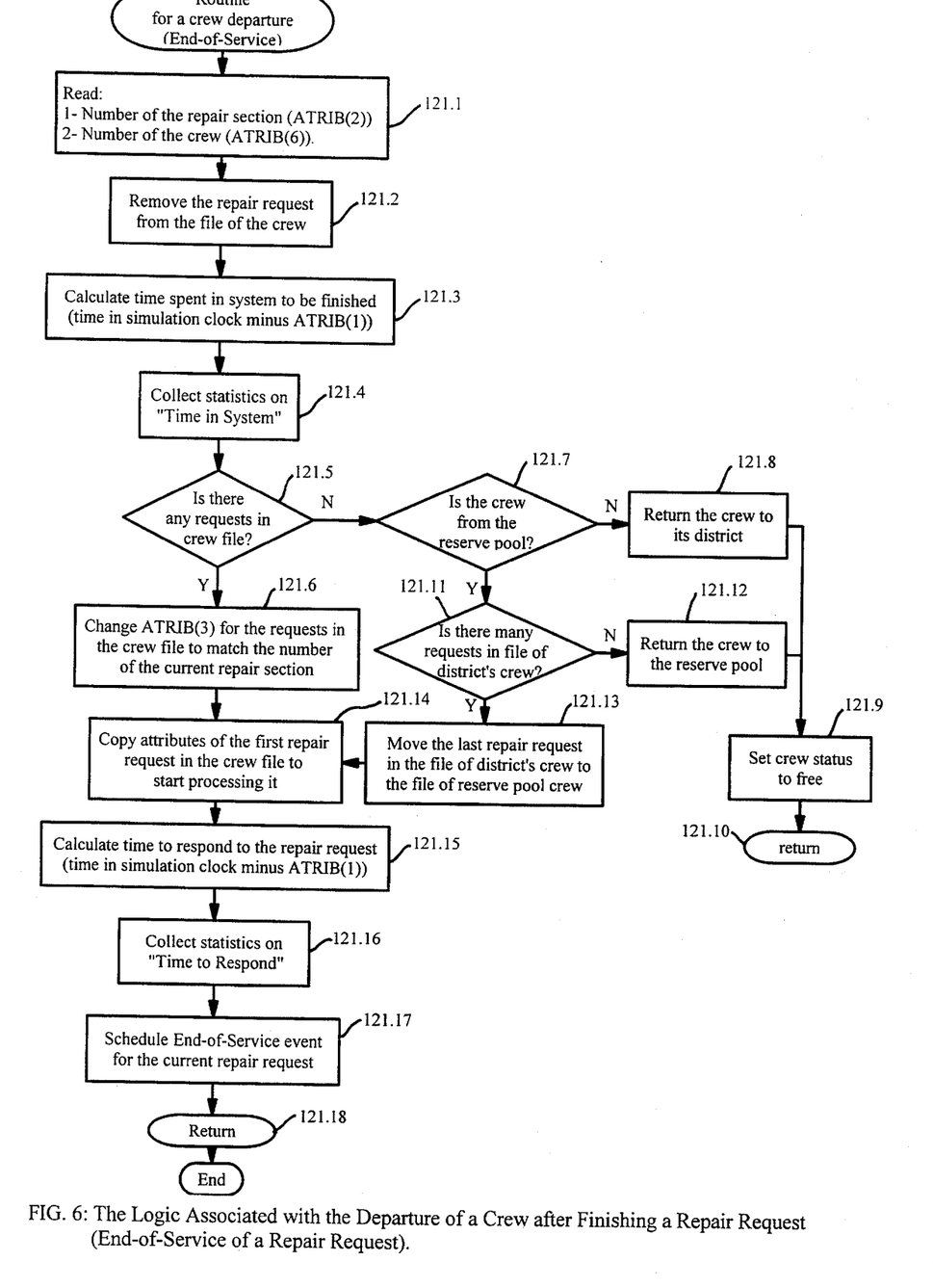
FIG. 6 The logic associated with the departure of a crew after finishing a repair request (End-of-Service of a repair request).

FIG. 6 is a flow chart that outlines the logic for the crew departure event. All the attributes of the current repair request associated with their values are passed to this event routine by the processor. The number of the current repair section and the number of the crew can be read 121.1 from attributes ATRIB(2), and ATRIB(6) respectively. Then, the current repair request is removed 121.2 from the crew file or in other words scheduled for end-of-service event after a time period equals 0.0. The time the repair request spent in the system from the moment it was put to the moment its pertinent maintenance work was accomplished is calculated 121.3 and statistics are collected 121.4. A test 121.5 is then made to check if more repair requests are still remaining in the crew file. If there is, the values of ATRIB(3) for all repair requests are changed 121.6 to match the number of the current repair section. If the file is empty, another test 121.7 is made to check whether this crew is from the reserve pool or not. If it is not, the crew is returned 121.8 to its district, its status is set 121.9 to free, and a return 121.10 is made to the processor. If the crew is from the reserve pool, a test 121.11 is made to check whether more than one repair request is waiting in the file of the current district's crew. If there is nothing, the reserve pool crew is returned 121.12 to the reserve pool, its status is set 121.9 to free, and a return 121.10 is made to the processor. If there is more than one repair request in the file of the district's crew, the reserve pool crew helps the current district's crew by moving 121.13 the last repair request from the district's crew file to the reserve pool crew file. Then, in 121.6, and 121.13 where either the crew file or the reserve pool crew file contains repair requests, the attributes of the first repair request is copied 121.14 in order to be processed. The time this repair request had to wait in the system to get a maintenance crew is calculated 121.15 and statistics are collected 121.16. Finally, this repair request is scheduled 121.17 for an end-of-service event, then, a return 121.18 is made to the processor.

The modeler and maintenance department should identify the most appropriate system performance measures for determining how closely a scenario meets the objectives of making the simulation study. The discrete-event simulator calculates the values of these measures for each repair request in the system and at the end of simulation time gives statistics for these variables including the range of the values, the mean, and the standard deviation. In this particular embodiment, this study meant to measure the delay in performing maintenance elapsed from the moment the repair request is made to the moment the required maintenance is completed and is referred to as the time in system, the time to respond to the repair request, and the utilization of the maintenance crews.

Experimentation and Analysis

This is the final stage in the method and is started after the simulation model is tested for verification and validation. At this stage, the model can be used as a framework to experiment different system parameters. Experiments are designed to study the effect of changing system parameters on the system performance measures and subsequently on the total costs. The simulation model is used as a robust technique to generate data in the form of three-dimensional surfaces that reflect the effect of changing two parameters on a performance measure or the total cost. Once surfaces are generated, appropriate mathematical optimization techniques are used to search the optimum scenario.

In this particular embodiment, the goal of the simulation model is to determine the optimum number of maintenance crews from each speciality in a highway maintenance department. This is achieved by calculating the delay of each repair request in the system. The delay in the system is the time elapsed from putting a repair request until it is accomplished. Then the number of crews and the delay time are used to estimate the total cost. The total cost equals the costs of hiring the maintenance crews for the planning period plus the public and maintenance department consequent costs of delaying maintenance during the same period. The simulation model is run under different scenarios to obtain the least cost scenario.

Summary, Ramifications, and Scope

Thus the reader will see that the maintenance management system of the invention provides a cost-effective and reliable method that can be used for staffing highway maintenance crews with the following advantages:
1. Emphasizes the concepts of standardization, and specialization as basis for the method to enhance productivity, efficiency, uniformity, and morale.
2. Introduces a realistic way for anticipating fixture maintenance workloads.
3. Outlines the existing repair request system by portraying the highway system configuration, setting the organization structure, and defining the logic for work assignment.
4. The simple highway maintenance model introduced herein can be restructured and extended to represent any real maintenance situation in order to estimate the number and speciality of crews needed to perform maintenance effectively.
5. Utilizes the advanced technique of discrete-event simulation to model the repair request system and run the developed model under various scenarios to find the best scenario.
6. Maximizes the cost-effectiveness of staffing by minimizing the total cost for the public and maintenance department.
7. Offers a tool that indirectly determines the amount and type of work to be contracted.
8. Provides a means to integrate the maintenance resource structure, maintenance strategy, and overall maintenance department objectives.
9. Offers not only a management tool for determining the optimal staffing but also an administrative technique for running maintenance operations.

Although the description above contains many specificities, these should not be construed as limiting the scope of the invention but as merely providing illustrations of some of the presently preferred embodiments of this invention. For example, the simulation model can be programmed using a general purpose language rather than a simulation language; determination of optimal staffing can be based on criteria rather than the minimum total cost including the utilization of crews or the time to respond to a repair request; standardization of crews can be totally discarded; different logic can be developed for the simulation events; performance prediction models can be used for anticipating future maintenance workloads, etc.

Thus the scope of the invention should be determined by the appended claims and their legal equivalents, rather than by the embodiment illustrated.

I claim:

1. A method for determining a staffing pattern that specifies a number of maintenance crews to be recruited by a highway maintenance department to adequately and efficiently handle work of a maintenance speciality and allocates said number of maintenance crews to divisions of said highway maintenance department, using a discrete-event simulation and an optimization technique, whereby resources can be utilized most effectively to render a state highway network of a predetermined performance level comprising the steps of:

making determinations that includes the steps of identifying said maintenance speciality, establishing a standard crew for said maintenance speciality, estimating a standard productivity rate for said standard crew, establishing an optimum maintenance workload for said standard crew, estimating costs of delaying maintenance of said maintenance speciality, and determining a planning period, building a model for said maintenance speciality that considers the steps of outlining a repair request system, preparing input data, and setting up said model, providing a change control mechanism to select and control effects of changes within said repair request system to control the execution of said discrete-event simulation, outputting information from said discrete-event simulation including performance measures of said repair request system, and performing the optimization which includes using said optimization technique to determine said number of maintenance crews for said maintenance speciality.

2. The method of claim 1 wherein said maintenance speciality could be identified based on a set of predetermined criteria established by said highway maintenance department to distinguish between maintenance and new construction.

3. The method of claim 1 wherein said standard crew constitutes a labor, technician, and foreman mix with adequate knowledge, skills, and capabilities required to effectively perform said maintenance speciality according to specifications.

4. The method of claim 1 wherein said standard productivity rate expresses a planned number of man-hours per a work-measurement unit of said maintenance speciality.

5. The method of claim 1 wherein said optimum maintenance workload comprises a definite work space of a definite number of work-measurement units that said standard crew can handle the most efficient way.

6. The method of claim 1 wherein said costs of delaying maintenance comprise costs of public and costs of said highway maintenance department.

7. The method of claim 6 wherein said costs of public include expenses of detouring, damages to cars, and accidents.

8. The method of claim 6 wherein said costs of said highway maintenance department include costs of constructing and maintaining detours, and subsequent deterioration.

9. The method of claim 1 wherein outlining said repair request system involves the steps of portraying a highway system configuration, defining an organization structure for said highway maintenance department, and setting a logic for work assignment.

10. The method of claim 9 wherein the step of portraying said highway system configuration involves the step of dividing up said state highway network to fixed repair sections each is equivalent to said optimum maintenance workload of said maintenance speciality.

11. The method of claim 9 wherein said organization structure involves recruiting personnel, establishing a number of said divisions of said highway maintenance department and a location of each, and defining flow lines of authority and responsibility within said highway maintenance department.

12. The method of claim 9 wherein setting said logic for work assignment involves the steps of assigning said number of maintenance crews to said divisions of said highway maintenance department, and setting priority rules for implementing repair requests.

13. The method in claim 1 wherein preparing said input data involves providing means to establish statistical distributions of parameters including interarrival time and service time of repair requests.

14. The method in claim 1 wherein said model considers the repair requests as customers and said maintenance crews as servers in said repair request system.

15. The method in claim 1 wherein said model duplicates said state highway network into multiple networks each represents one said maintenance speciality.

16. The method in claim 1 wherein the step of providing said change control mechanism includes providing a simulation processor to control:

providing simulation events which are actions with a simulation time, storing the future events on an event queue, which contains an ordered list of said simulation events, each with an associated time, running said discrete-event simulation which includes the steps of executing the next event on said event queue, and halting when there are no more events on said event queue, and storing said simulation time which is the time value of the event being executed, into a simulation clock variable.

17. The method in claim 1 wherein performing optimization involves determining said number of maintenance crews based on criteria including said performance measures, and the costs of hiring said number of maintenance crews plus said costs of delaying maintenance.

18. A simulation-based tool for determining a staffing pattern that specifies a number of maintenance crews that sufficiently and efficiently take care of a maintenance speciality and a distribution of said number of maintenance crews among divisions of a highway maintenance department, whereby maintenance work of a state highway network can be achieved effectively comprising:

determinations including the steps of identifying said maintenance speciality, establishing a standard crew for said maintenance speciality, estimating a standard productivity rate for said standard crew, establishing an optimum maintenance workload for said standard crew, estimating costs of delaying maintenance of said maintenance speciality, and determining a planning period, a model for a repair request system that formulates a configuration of said state highway network, defines an organization structure of said highway maintenance department, defines a logic for work assignments, and prepares input data to set up said model, a change control mechanism to select and control effects of changes within said repair request system, a discrete-event simulator including an event queue containing an ordered list of simulation events, and a clock containing the time of said simulation events, means for running said discrete-event simulator, means for outputting information regarding performance measures of said repair request system, and means for determining said number of maintenance crews based on criteria including the summation of said cost of delaying maintenance and the cost of hiring said number of maintenance crews, and predetermined values of said performance measures.

* * * * *